(12) United States Patent
Saito

(10) Patent No.: US 11,756,809 B2
(45) Date of Patent: Sep. 12, 2023

(54) TAPE ATTACHING APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 64 days.

(21) Appl. No.: 17/163,849

(22) Filed: Feb. 1, 2021

(65) Prior Publication Data

US 2021/0257232 A1 Aug. 19, 2021

(30) Foreign Application Priority Data

Feb. 14, 2020 (JP) .................................. 2020-023266

(51) Int. Cl.
*H01L 21/67* (2006.01)
*H01L 21/683* (2006.01)

(52) U.S. Cl.
CPC .... *H01L 21/67132* (2013.01); *H01L 21/6838* (2013.01)

(58) Field of Classification Search
CPC ........... H01L 21/67132; H01L 21/6838; H01L 21/67103; H01L 21/6836; B08B 5/02
See application file for complete search history.

(56) References Cited

U.S. PATENT DOCUMENTS

| 4,787,951 | A | * | 11/1988 | Okamoto | .......... H01L 21/67132 156/481 |
| 6,007,654 | A | * | 12/1999 | McKenna | ........... B29C 63/0047 156/382 |
| 10,872,791 | B2 | * | 12/2020 | Sekiya | .............. H01L 21/67132 |
| 2011/0232820 | A1 | * | 9/2011 | Yamamoto | ........ H01L 21/67132 156/60 |
| 2016/0079098 | A1 | * | 3/2016 | Taga | ................. H01L 21/67092 156/285 |

FOREIGN PATENT DOCUMENTS

| JP | 2007019461 A | 1/2007 |
| JP | 2007073767 A | 3/2007 |
| JP | 2017050388 A | 3/2017 |

\* cited by examiner

*Primary Examiner* — George R Koch
*Assistant Examiner* — Christopher C Caillouet
(74) *Attorney, Agent, or Firm* — Greer Burns & Crain Ltd.

(57) ABSTRACT

After the inside of a sealed accommodating chamber of a tape attaching apparatus is decompressed, a dicing tape covering a back surface of a wafer is attached to an upper surface of an annular projection of the wafer. Thereafter, the inside of the accommodating chamber is pressurized, to press the dicing tape toward the recess in the back surface of the wafer. As a result, the dicing tape can be attached, substantially without a gap, to substantially the whole area of the back surface of the wafer inclusive of a corner part which is the boundary between the recess and the annular projection. By adjusting the air pressure inside the accommodating chamber, the dicing tape can be easily attached to substantially the whole area of the back surface of the wafer in a short time.

7 Claims, 6 Drawing Sheets

TAPE ATTACHING APPARATUS

BACKGROUND OF THE INVENTION

Field of the Invention

The present invention relates to a tape attaching apparatus.

Description of the Related Art

Japanese Patent Laid-open No. 2007-073767 and Japanese Patent Laid-open No. 2017-050388 disclose a tape attaching apparatus for attaching a tape to a surface on one side of a workpiece for protecting the surface. In this apparatus, the tape is attached to the workpiece in a vacuum chamber, whereby a dead air space is prevented from being generated between the tape and the workpiece.

In addition, Japanese Patent Laid-open No. 2007-019461 discloses a so-called TAIKO process (TAIKO is a registered trademark by DISCO CORPORATION). In this process, a central portion of a wafer is ground by a grindstone, to form a TAIKO wafer which has a circular recess in a central portion and an annular projection in the periphery of the circular recess. Thereafter, the TAIKO wafer is divided, to obtain a plurality of chips.

In the division, a tape is attached to the circular recess of the wafer, and the periphery of the circular recess is processed into an annular shape, to remove the annular projection. Thereafter, the wafer is divided along streets between a plurality of devices formed on a surface on one side of the wafer.

SUMMARY OF THE INVENTION

According to the related technique aforementioned, at the time of processing into an annular shape for removing the annular projection of the TAIKO wafer, large chipping may be formed, and the wafer may be cracked with the chipping as a start point. In addition, at the time of dividing the wafer along the streets, a triangular chip formed at the periphery of the wafer may be scattered.

As a countermeasure against such a problem, it is preferable to attach a tape to the boundary between the annular projection and the circular recess of the TAIKO wafer. In other words, after the tape is attached to the TAIKO wafer in a vacuum chamber, the TAIKO wafer is exposed to the atmospheric pressure. As a result, the tape is pressed by the atmospheric pressure, to be brought into close contact with the boundary (corner part) between the annular projection and the circular recess. In addition, softening the tape by heating enables the close contact much easily.

However, it takes time to bring the tape into close contact by the above-mentioned method. In addition, it also takes time for softening the tape. Besides, a cooling time for cooling the heated tape is also required.

Accordingly, it is an object of the present invention to provide a tape attaching apparatus by which a tape can be attached to a TAIKO wafer in such a manner that the tape is brought into close contact with a corner part between an annular projection and a circular recess of the TAIKO wafer in a short time.

In accordance with an aspect of the present invention, there is provided a tape attaching apparatus for attaching a tape to a surface on one side of a disk-shaped workpiece having a circular recess in a center of the surface on the one side and having an annular projection on an outside of the recess, the tape attaching apparatus including mounting means that has a mount surface on which to mount a surface on the other side of the workpiece, tape disposing means that disposes the tape so as to cover the surface on the one side of the workpiece mounted on the mount surface, a roller for pressing the tape against the workpiece, roller moving means for moving the roller so as to roll on an upper surface of the tape, an accommodating chamber that accommodates at least the mounting means and the roller, decompressing means for decompressing an inside of the accommodating chamber, pressurizing means for pressurizing the inside of the accommodating chamber, and a control unit that controls decompression of the inside of the accommodating chamber by use of the decompressing means, attachment of the tape to a tip end of the projection of the workpiece by use of the roller moving means, and pressurization of the inside of the accommodating chamber by use of the pressurizing means to press the tape against a corner part between the recess and the projection.

Preferably, the tape disposing means includes a frame unit having an annular ring frame having an opening in which the workpiece is able to be accommodated, and the tape attached to the ring frame so as to close the opening.

Preferably, the tape attaching apparatus further includes a heater for heating the tape. The control unit, at a time of pressurizing the inside of the accommodating chamber, heats the taper by use of the heater to soften the tape and presses the tape against the corner part.

In addition, in this case, the tape may have an adhesive layer on only a part corresponding to the ring frame, and the tape is pressed against the corner part by heating by the heater and pressurizing by the pressurizing means.

Preferably, the pressurizing means is air supplying means for jetting air, and the control unit jets air to the mount surface by use of the air supplying means to clean the mount surface.

In the present tape attaching apparatus, after the inside of the accommodating chamber is decompressed, the tape covering a surface on one side of the workpiece is attached to the tip end of the annular projection of the workpiece. Thereafter, the inside of the accommodating chamber is pressurized, whereby the tape is pressed toward the recess formed in the surface on the one side of the workpiece. Accordingly, the tape can be attached, substantially without a gap, to substantially the whole area of the surface on the one side of the workpiece inclusive of the corner part which is the boundary between the recess and the annular projection.

In this way, in the present tape attaching apparatus, by adjusting the air pressure inside the accommodating chamber, the tape can be attached to substantially the whole area of the surface on the one side of the workpiece, easily and in a short time.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
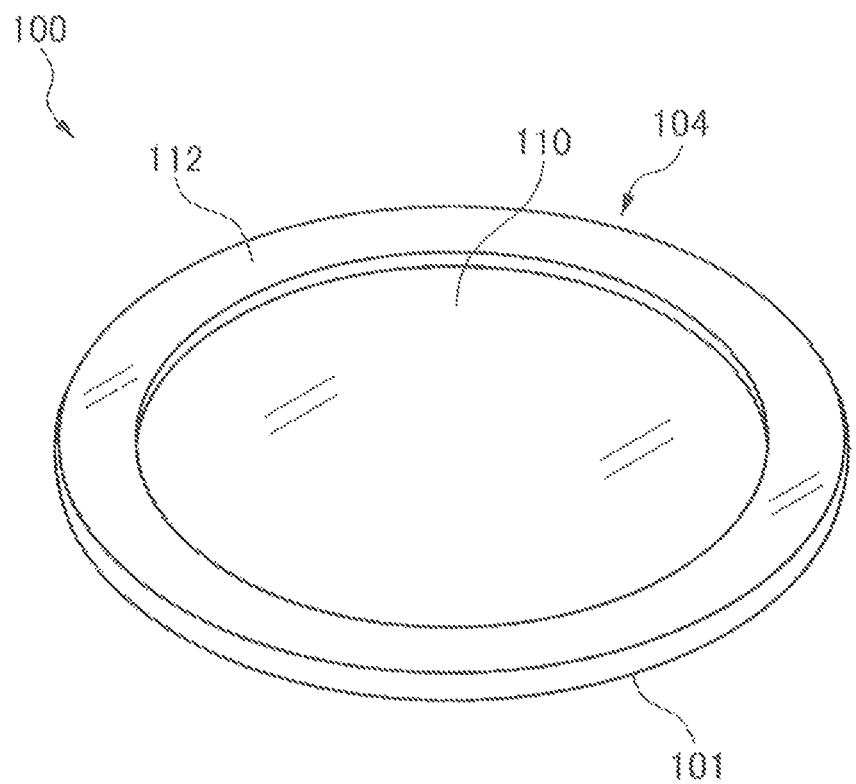
FIG. 1 is a perspective view depicting a configuration of a TAIKO wafer.
Figure 2:
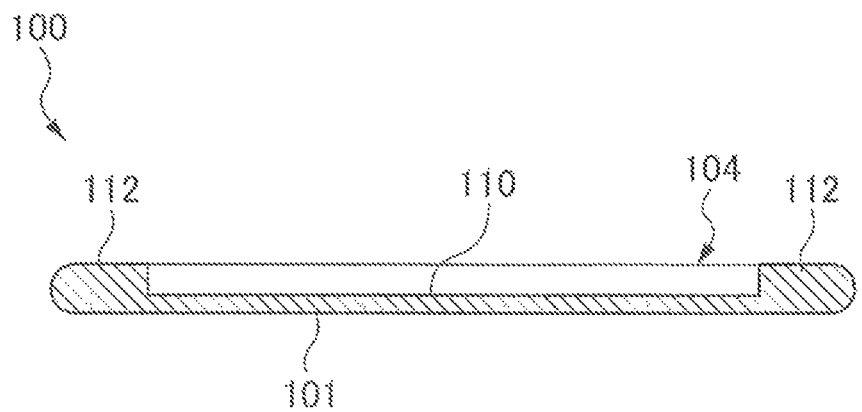
FIG. 2 is a sectional view depicting the configuration of the TAIKO wafer.

As illustrated in FIGS. 1 and 2, a wafer 100 as a disk-shaped workpiece according to the present embodiment includes a circular recess 110 in the center of a back surface 104 which is a surface on one side of the wafer 100. Further, the wafer 100 includes an annular projection 112 on the outside of the recess 110.

Thus, the wafer 100 is a generally-called TAIKO wafer which is thinned in the center and is reinforced by the peripheral annular projection 112 such that the wafer 100 is not warped or cracked. Note that a front surface 101 which is a surface on the other side of the wafer 100 is formed with a plurality of devices (not illustrated).

Figure 3:
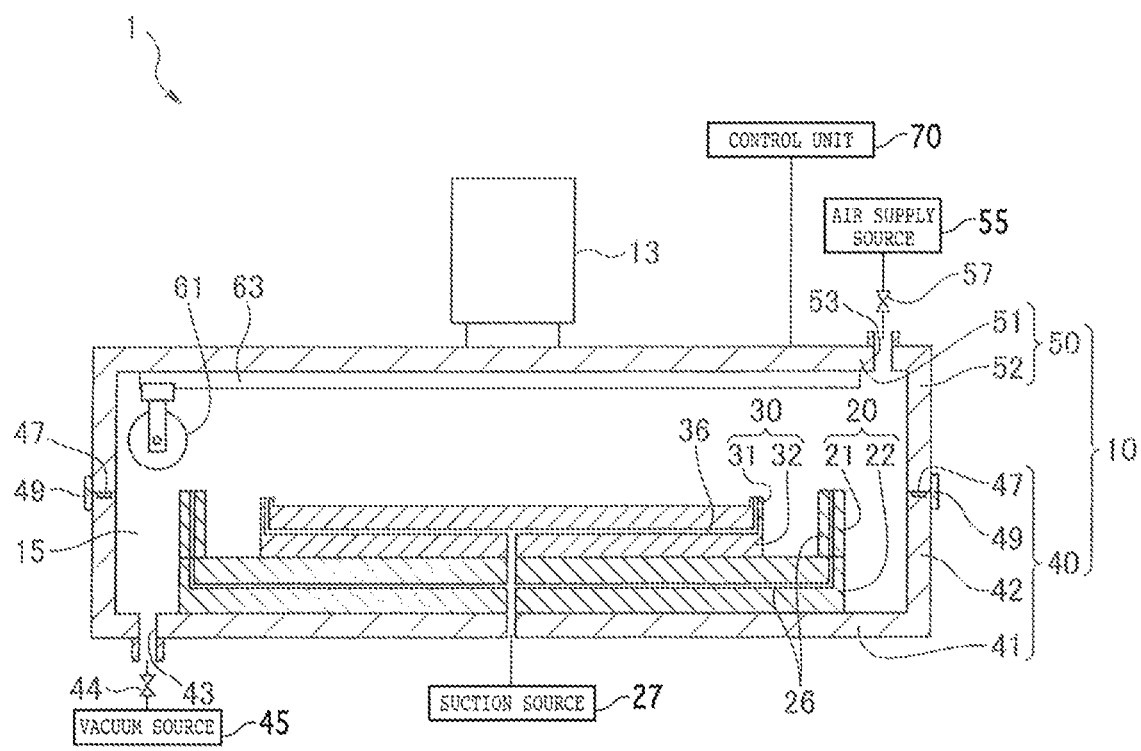
FIG. 3 is a sectional view depicting a configuration of a tape attaching apparatus.

A tape attaching apparatus 1 according to the present embodiment depicted in FIG. 3 attaches a tape to the back surface 104 of the wafer 100. Note that the back surface 104 of the wafer 100 is also formed with a plurality of devices in some cases and in this case, the tape is attached to the devices.

As depicted in FIG. 3, the tape attaching apparatus 1 includes a housing 10 including an upper-side housing 50 and a lower-side housing 40, and opening-closing means 13. The upper-side housing 50 and the lower-side housing 40 are in a bottomed tubular shape. The housing 10 is configured by connecting the upper-side housing 50 and the lower-side housing 40 while laying on top of another such that their openings face each other. The opening-closing means 13 moves the upper-side housing 50 in the vertical direction relative to the lower-side housing 40.

The housing 10 has an accommodating chamber 15 as an inside space. The upper-side housing 50 is moved downward by the opening-closing means 13, and is connected to the lower-side housing 40, whereby the housing 10 is closed, and the accommodating chamber 15 inside thereof is sealed. In addition, the upper-side housing 50 is moved upward by the opening-closing means 13, and is separated from the lower-side housing 40, whereby the housing 10 and the accommodating chamber 15 are opened, and the sealing of the accommodating chamber 15 is broken.

The upper-side housing 50 has a disk-shaped upper-side bottom section 51, and a tubular upper-side side section 52 provided on the periphery of the upper-side bottom section 51. The upper-side bottom section 51 is provided with an air supply port 53. The air supply port 53 is connected to an air supply source 55 provided as air supplying means for jetting air, through a pressurizing valve 57. The air supply source 55 can supply air into the sealed accommodating chamber 15 through the air supply port 53, thereby pressurizing the inside of the accommodating chamber 15. Thus, the air supply source 55 functions as pressurizing means for pressurizing the inside of the accommodating chamber 15.

The lower-side housing 40 includes a disk-shaped lower-side bottom section 41, and a tubular lower-side side section 42 provided on the periphery of the lower-side bottom section 41. The lower-side bottom section 41 is provided with a decompression port 43. The decompression port 43 is connected to a vacuum source 45 through a vacuum valve 44. The vacuum source 45 is, for example, a vacuum pump. The vacuum source 45 can suck in the air in the sealed accommodating chamber 15 through the decompression port 43, to thereby reduce the pressure inside the accommodating chamber 15. Thus, the vacuum source 45 functions as decompressing means for decompressing the inside of the accommodating chamber 15.

Note that the lower-side side section 42 can be connected to the upper-side side section 52 of the upper-side housing 50 through a packing 47. With the lower-side side section 42 and the upper-side side section 52 connected to each other through the packing 47, the degree of sealing of the accommodating chamber 15 inside the housing 10 can be enhanced.

In the present embodiment, when the lower-side side section 42 and the upper-side side section 52 are connected, they are fixed to each other by a lock member 49. As a result, the connection between the lower-side side section 42 and the upper-side side section 52 can be prevented from being released when the inside of the accommodating chamber 15 is pressurized.

A frame holding table 20 is disposed inside the lower-side housing 40, and a wafer holding table 30 as an example of mounting means is disposed on the frame holding table 20.

The wafer holding table 30 has a disk-shaped base 32, and a thin tubular wafer holding section 31 provided on the periphery of the base 32. The wafer holding section 31 functions as a mount surface on which to mount the front surface 101 of the wafer 100, and suction holds the front surface 101 of the wafer 100. The wafer holding section 31 and the base 32 are provided therein with a first suction passage 36. The first suction passage 36 can communicate with a suction source 27 disposed in the exterior of the housing 10.

The frame holding table 20 is used for disposing a dicing tape 122 in such a manner as to cover the back surface 104 of the wafer 100 mounted on the wafer holding section 31 of the wafer holding table 30. The frame holding table 20 has a disk-shaped base 22 supported by the lower-side bottom section 41 of the lower-side housing 40, and a tubular frame holding section 21 provided on the periphery of the base 22.

Figure 4:
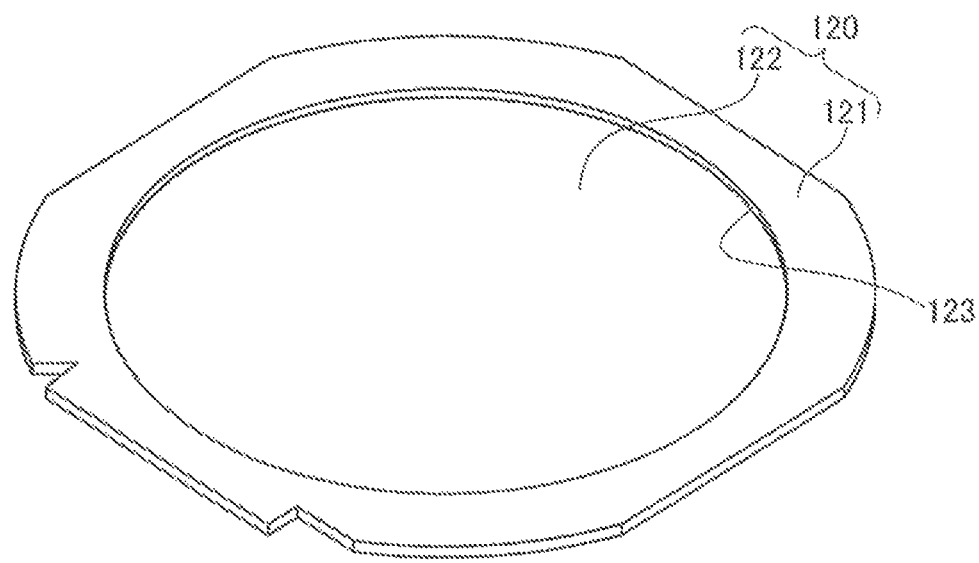
FIG. 4 is a perspective view depicting a configuration of a frame unit.

As illustrated in FIG. 4, the dicing tape 122 which is a tape attached to the wafer 100 in the present embodiment is handled in the state of a frame unit 120. The frame unit 120 includes an annular ring frame 121 having an opening 123 in which the wafer 100 can be accommodated, and the dicing tape 122 attached to the ring frame 121 in such a manner as to close the opening 123. Thus, the dicing tape 122 is used in a state in which the ring frame 121 is attached to the periphery thereof, namely, in a state in which the ring frame 121 is supported by the dicing tape 122. Such a frame unit 120 is mounted on the frame holding table 20.

The frame holding section 21 of the frame holding table 20 depicted in FIG. 3 is used for mounting and suction holding thereon the ring frame 121 which supports the dicing tape 122. For this purpose, the frame holding section 21 and the base 22 of the frame holding table 20 are provided therein with a second suction passage 26. The second suction passage 26 can communicate with the suction source 27, like the first suction passage 36.

In addition, the upper-side bottom section 51 of the upper-side housing 50 is provided with roller moving means 63, and a roller 61 as an attaching roller is attached to the roller moving means 63. The roller 61 is used for pressing the dicing tape 122 against the wafer 100. The roller moving means 63 includes rails and a motor or the like for moving the roller 61, and can move the roller 61 in the manner of rolling on an upper surface of the dicing tape 122.

In this way, in the tape attaching apparatus 1 according to the present embodiment, the roller 61, the roller moving means 63, the frame holding table 20, and the wafer holding table 30 are accommodated in the accommodating chamber 15.

In addition, the tape attaching apparatus 1 has a control unit 70 for controlling each member of the tape attaching apparatus 1. An attaching operation for the dicing tape 122 in the tape attaching apparatus 1 will be described below, together with the function of the control unit 70.

Figure 5:
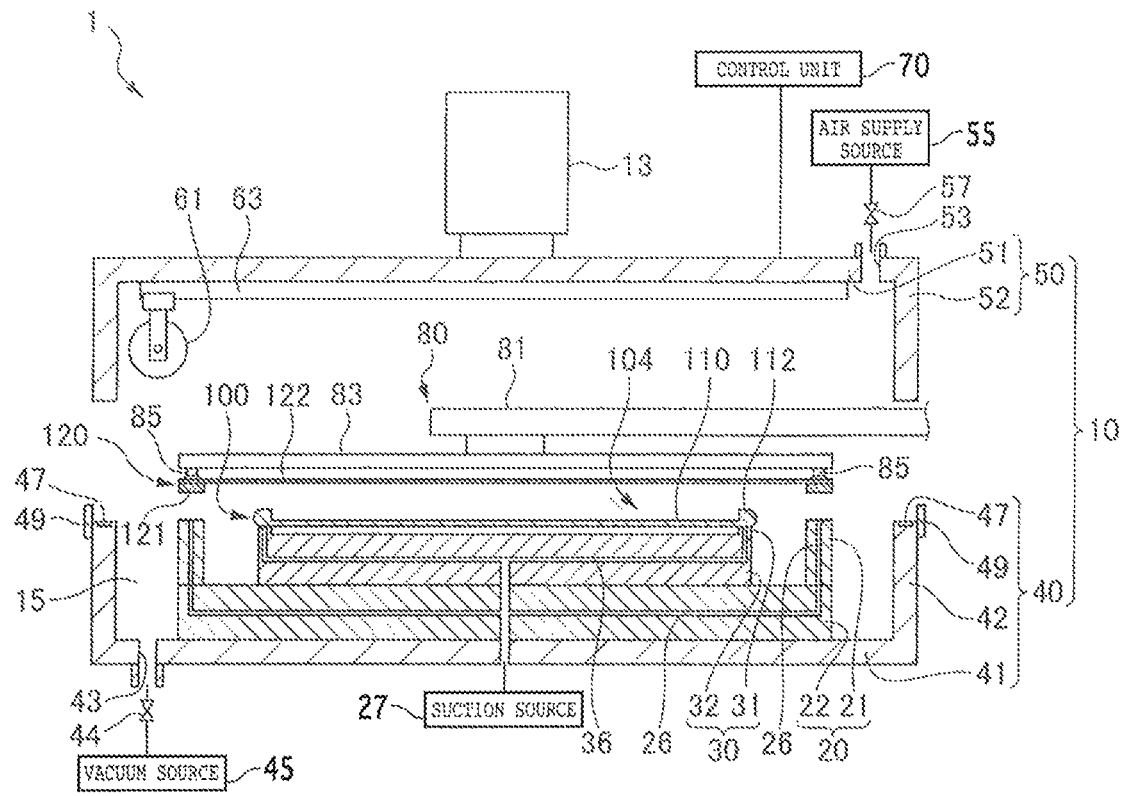
FIG. 5 is a sectional view depicting a manner of disposing the frame unit inside a housing of the tape attaching apparatus.

As depicted in FIG. 5, at the time of starting an operation, the upper-side housing 50 is raised by the opening-closing means 13, the connection between the upper-side housing 50 and the lower-side housing 40 is released, and the housing 10 and the accommodating chamber 15 are in an opened state. Note that, in this instance, the vacuum valve 44 and the pressurizing valve 57 are both in a closed state.

In this state, the wafer 100 is mounted on the wafer holding table 30 such that the back surface 104 having the recess 110 is directed to the upper side. In this instance, the annular projection 112 of the wafer 100 is disposed on the wafer holding section 31 of the wafer holding table 30. Then, the first suction passage 36 is made to communicate with the suction source 27, and the wafer holding section 31 suction holds the annular projection 112 of the wafer 100.

Note that, as aforementioned, the wafer holding section 31 has a thin tubular shape provided on the periphery of the disk-shaped base 32, and projects to the upper side from the base 32. In the present embodiment, therefore, the front surface 101 of the wafer 100 which is a lower surface of the wafer 100 on the wafer holding table 30 can be prevented from coming in contact with the base 32. As a result, devices formed on the front surface 101 can be protected.

Next, the frame unit 120 is mounted on the frame holding table 20 by carrying means 80. The carrying means 80 is an example of tape disposing means, and disposes the dicing tape 122 in such a manner as to cover the back surface 104 of the wafer 100 mounted on the wafer holding section 31 of the wafer holding table 30. For this purpose, the carrying means 80 uses the frame unit 120 including the dicing tape 122.

In other words, the carrying means 80 includes a disk-shaped base 83, suction pads 85 provided at a plurality of locations of the periphery of the base 83, and an arm 81 which supports the center of the base 83 and can move the base 83 in the vertical direction and a horizontal direction.

The carrying means 80, in a state in which the ring frame 121 of the frame unit 120 depicted in FIG. 4 is suction held by the suction pads 85, inserts the base 83 between the upper-side housing 50 and the lower-side housing 40 by the arm 81, and disposes the base 83 on an upper side of the frame holding table 20.

Thereafter, the carrying means 80 lowers the base 83 by use of the arm 81, and mounts the ring frame 121 on the frame holding section 21 of the frame holding table 20. Thereafter, the carrying means 80 retracts the base 83 to the outside of the housing 10 by use of the arm 81.

In addition, the second suction passage 26 is made to communicate with the suction source 27, and the frame holding section 21 suction holds the ring frame 121 of the frame unit 120. As a result, the back surface 104 of the wafer 100 mounted on the wafer holding section 31 is covered by the dicing tape 122 of the frame unit 120.

Figure 6:
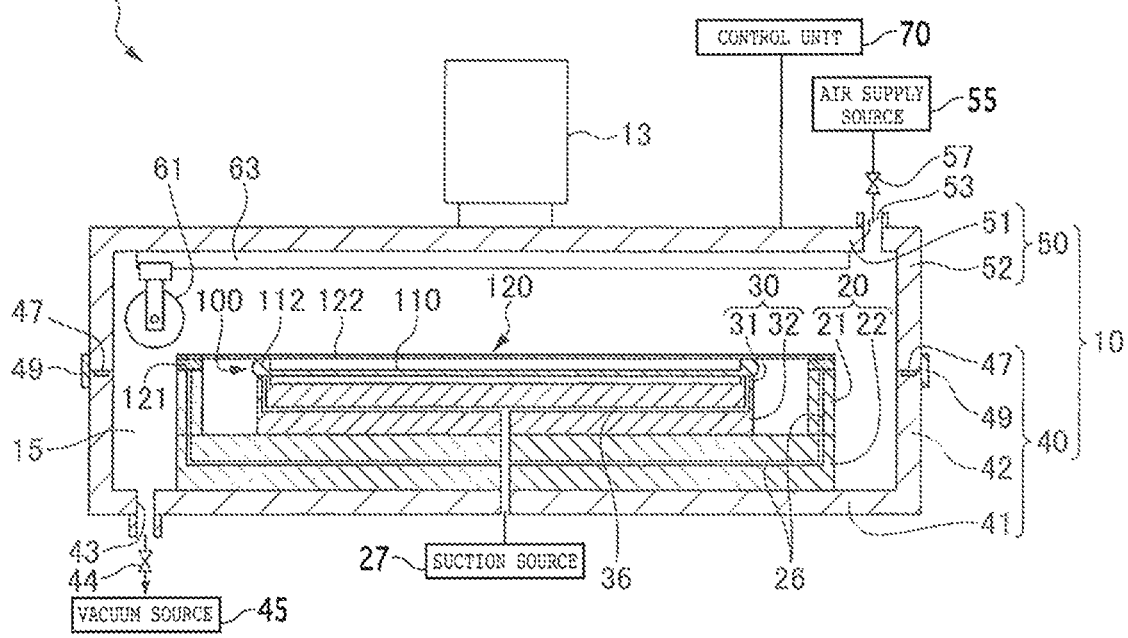
FIG. 6 is a sectional view depicting a state in which an accommodating chamber of the tape attaching apparatus is sealed.

Next, as depicted in FIG. 6, the upper-side housing 50 is lowered by the opening-closing means 13, the upper-side side section 52 of the upper-side housing 50 and the lower-side side section 42 of the lower-side housing 40 are connected to each other through the packing 47, and they are fixed by the lock member 49. As a result, the accommodating chamber 15 inside the housing 10 is sealed.

In this state, the control unit 70 opens the vacuum valve 44, to let the decompression port 43 and the vacuum source 45 communicate with each other. As a result, the vacuum source 45 sucks in the air in the sealed accommodating chamber 15 through the decompression port 43. Consequently, the inside of the accommodating chamber 15 is decompressed, and a space between the recess 110 of the wafer 100 held by the wafer holding table 30 and the dicing tape 122 covering the upper side thereof is also decompressed.

Figure 7:
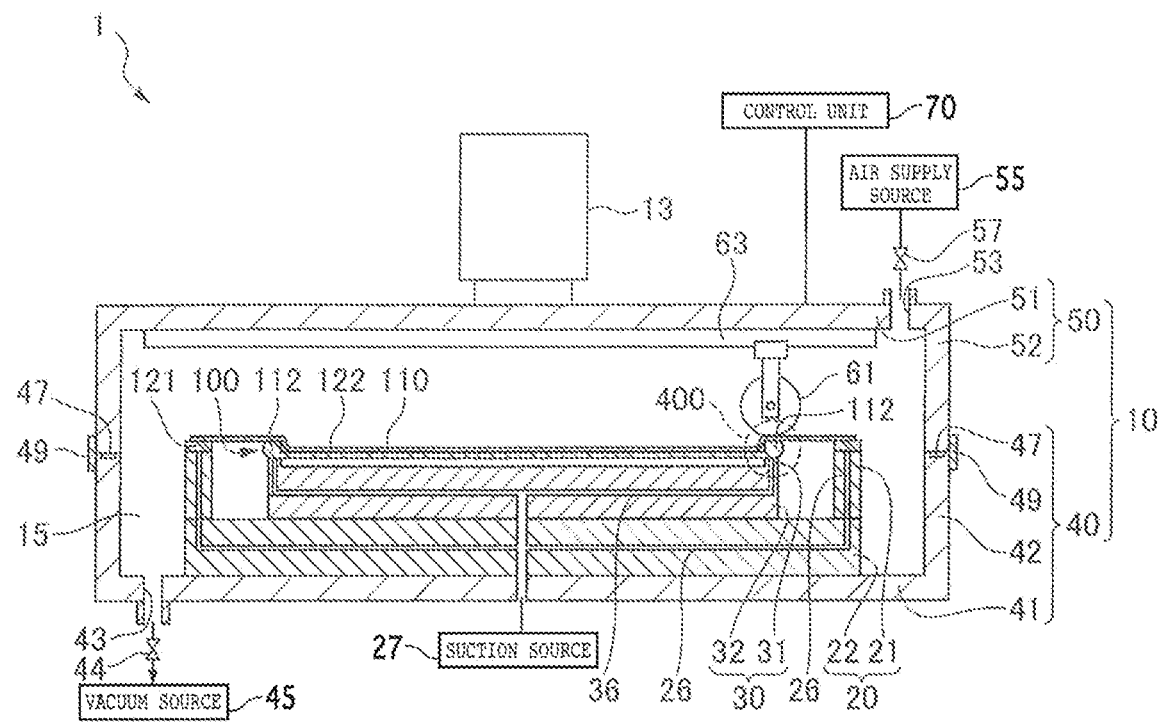
FIG. 7 is a sectional view depicting a state in which the inside of the accommodating chamber is decompressed.
Figure 8:
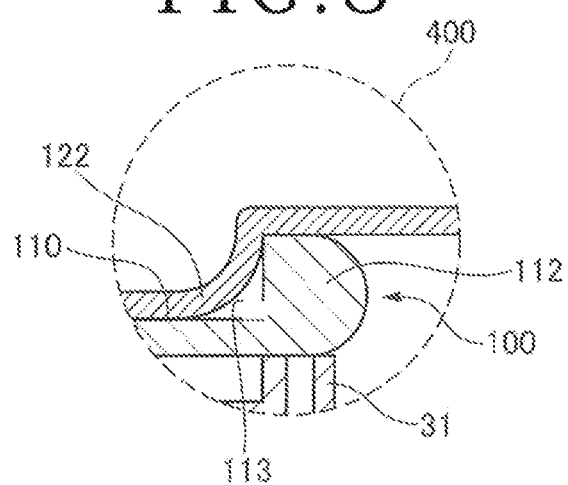
FIG. 8 is an enlarged sectional view depicting, in an enlarged form, a region surrounded by a dotted line in FIG. 7.

By such decompression, the dicing tape 122 droops to come in contact with the recess 110, as depicted in FIG. 7. However, as depicted in FIG. 8, in the vicinity of the annular projection 112 of the wafer 100, the dicing tape 122 may not have yet been attached to (come in close contact with) a corner part 113 which is the boundary between the recess 110 and the annular projection 112 of the wafer 100. In FIG. 8, a region 400 in the vicinity of the annular projection 112 that is surrounded by a dotted line in FIG. 7 is depicted in an enlarged form.

Note that, when the inside of the accommodating chamber 15 is decompressed, the suction holding of the wafer 100 by the wafer holding section 31 and the suction holding of the ring frame 121 by the frame holding section 21, by use of the suction source 27, may be stopped.

Next, the control unit 70 presses the dicing tape 122, located on an upper side of the annular projection 112 of the wafer 100, against the tip end (upper surface) of the annular projection 112 and attaches the dicing tape 122 to the tip end, by use of the roller moving means 63.

In other words, as depicted in FIG. 7, the control unit 70 controls the roller moving means 63 to roll the roller 61 along the dicing tape 122 on the annular projection 112 of the wafer 100, thereby pressing the dicing tape 122 against the annular projection 112. Accordingly, the dicing tape 122 is firmly attached to the upper surface of the annular projection 112 of the wafer 100. As a result, a space between the recess 110 and the dicing tape 122 is substantially isolated from the accommodating chamber 15 by the dicing tape 122.

Figure 9:
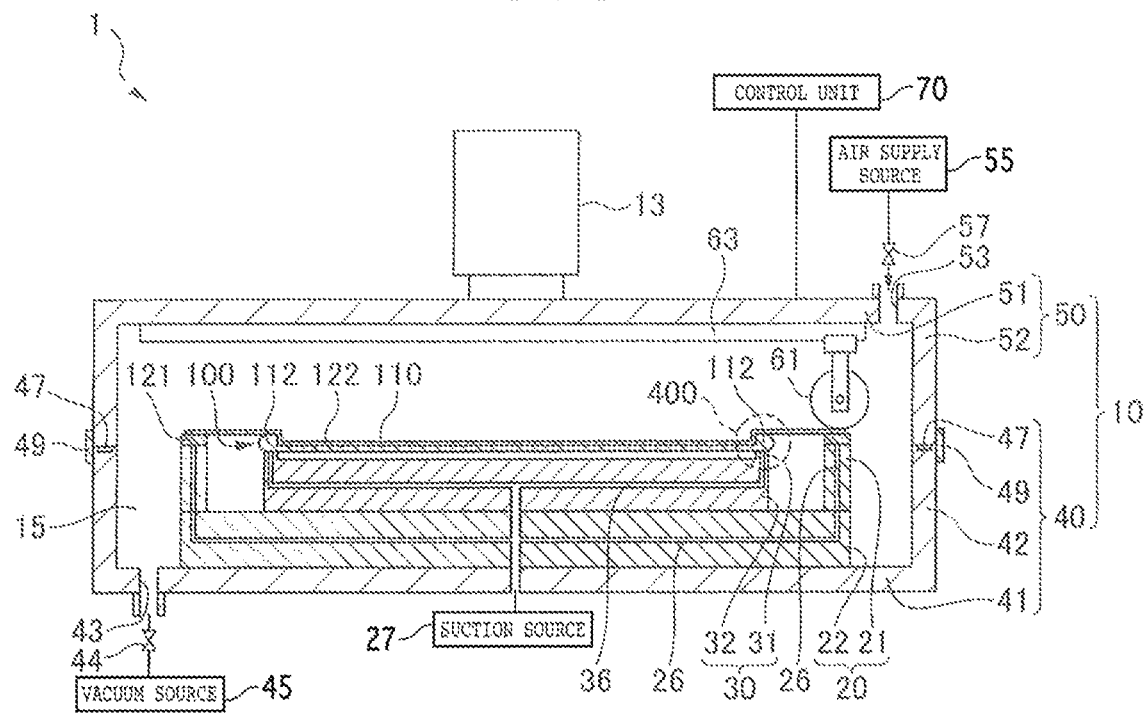
FIG. 9 is a sectional view depicting a state in which the inside of the accommodating chamber is pressurized.

Next, as illustrated in FIG. 9, the control unit 70 closes the vacuum valve 44, and opens the pressurizing valve 57. As a result, communication between the decompression port 43 and the vacuum source 45 is interrupted, and the air supply port 53 and the air supply source 55 are communicated with each other. In this way, the control unit 70 sends air into the sealed accommodating chamber 15 and pressurizes the inside of the accommodating chamber 15, by use of the air supply source 55.

Figure 10:
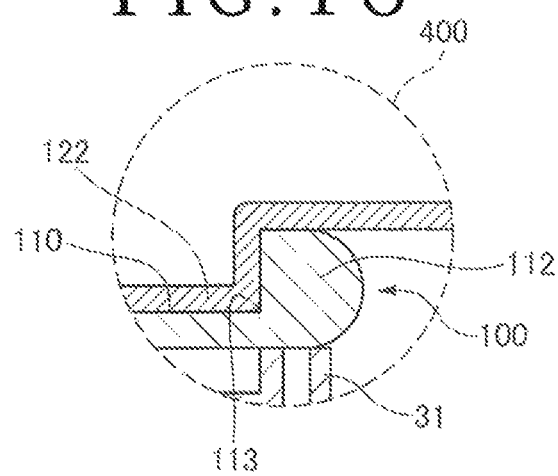
FIG. 10 is an enlarged sectional view depicting, in an enlarged form, a region surrounded by a dotted line in FIG. 9.

Accordingly, an air pressure difference is generated between the pressurized accommodating chamber 15 and the space between the recess 110 and the dicing tape 122 that is substantially isolated from the accommodating chamber 15. As a result, the dicing tape 122 is pressed in the direction from the accommodating chamber 15 toward the recess 110. Therefore, as illustrated in FIG. 10, also in the vicinity of the annular projection 112 of the wafer 100, the dicing tape 122 is pressed also against the corner part 113 which is the boundary between the recess 110 and the annular projection 112 of the wafer 100.

Therefore, the dicing tape 122 is attached to the back surface 104 of the wafer 100 such that the dicing tape 122 comes in close contact with the corner part 113. In other words, the dicing tape 122 is attached to (comes in close contact with) substantially the whole area of the back surface 104 of the wafer 100 inclusive of the corner part 113, substantially without gap.

As has been described above, in the present embodiment, after the sealed accommodating chamber 15 is decompressed, the dicing tape 122 covering the back surface 104 of the wafer 100 is attached to the upper surface of the annular projection 112 of the wafer 100. Thereafter, by pressurizing the inside of the accommodating chamber 15, the dicing tape 122 is pressed toward the recess 110 formed in the back surface 104 of the wafer 100. Accordingly, the dicing tape 122 can be attached to substantially the whole area of the back surface 104 of the wafer 100, inclusive of the corner part 113 which is the boundary between the recess 110 and the annular projection 112, substantially without gap.

In this way, in the present embodiment, by adjusting the air pressure inside the accommodating chamber 15, the dicing tape 122 can be easily attached to substantially the whole area of the back surface 104 of the wafer 100 in a short time.

Figure 11:
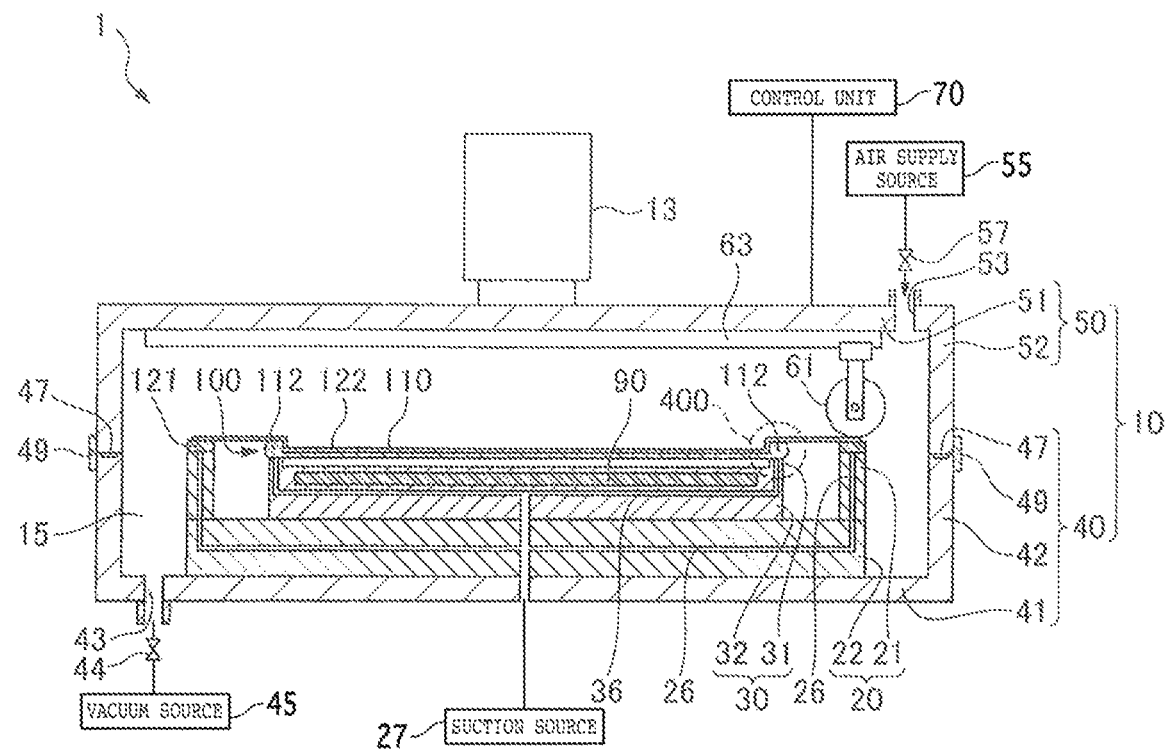
FIG. 11 is a sectional view depicting another embodiment of the tape attaching apparatus.

In another embodiment of the present invention, as depicted in FIG. 11, the tape attaching apparatus 1 may further include a heater 90 for heating the dicing tape 122, for example, in the base 32 of the wafer holding table 30. According to this configuration, at the time of pressurizing the inside of the accommodating chamber 15, the dicing tape 122 covering the recess 110 of the wafer 100 can be heated and softened by the heater 90.

Accordingly, the dicing tape 122 can be attached more easily to substantially the whole area of the back surface 104 of the wafer 100. Note that the timing for heating the dicing tape 122 by the heater 90 may be before, during, or after pressurizing the inside of the accommodating chamber 15.

In addition, in the case of using the configuration depicted in FIG. 11, the dicing tape 122 may be provided with an adhesive layer only at a part corresponding to the ring frame 121. By heating by the heater 90 and pressurizing by use of the air supply source 55 as pressurizing means, the dicing tape 122 may be pressed against the corner part 113.

Besides, in a further embodiment, the control unit 70 may clean the wafer holding section 31 of the wafer holding table 30 which is a mount surface for mounting the front surface 101 of the wafer 100 thereon, by use of the air supply source 55. In this case, the air supply port 53 may be provided with a nozzle permitting air to be easily jetted to the wafer holding section 31.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tape attaching apparatus for attaching a tape to a surface on one side of a disk-shaped workpiece having a circular recess in a center of the surface on the one side and having an annular projection on an outside of the recess, the tape attaching apparatus comprising:
   mounting means having a base, a wafer holding section protruding from and extending along a periphery of the base, the wafer holding section having an annular shape corresponding to the annular projection of the workpiece and a mount surface, spaced from the base, for directly supporting a surface on other side of the workpiece opposite the annular projection of the workpiece while being in non-contact with a remaining part of the other side surface of the workpiece, and a first suction passage extending through the base and terminating at the mount surface of the wafer holding section, the first suction passage being in communication with a suction source for applying a suction directly to the surface on the other side of the workpiece opposite the annular projection for holding the workpiece against the mount surface;
   tape disposing means that disposes the tape so as to cover the surface on the one side of the workpiece mounted on the mount surface;
   a roller for pressing the tape against the workpiece;
   roller moving means for moving the roller so as to roll on an upper surface of the tape;
   an accommodating chamber that accommodates at least the mounting means and the roller;
   decompressing means for decompressing an inside of the accommodating chamber;
   pressurizing means for pressurizing the inside of the accommodating chamber; and
   a control unit that controls decompression of the inside of the accommodating chamber by use of the decompressing means, attachment of the tape to a tip end of the projection of the workpiece by use of the roller moving means, and pressurization of the inside of the accommodating chamber by use of the pressurizing means to press the tape against a corner part between the recess and the projection.

2. The tape attaching apparatus according to claim 1, wherein the tape disposing means includes a frame unit having an annular ring frame having an opening in which the workpiece is able to be accommodated, and the tape attached to the ring frame so as to close the opening.

3. The tape attaching apparatus according to claim 2, further comprising:
   a heater for heating the tape,
   wherein the control unit, at a time of pressurizing the inside of the accommodating chamber, heats the tape by use of the heater to soften the tape and presses the tape against the corner part.

4. The tape attaching apparatus according to claim 3, wherein the tape has an adhesive layer on only a part corresponding to the ring frame, and the tape is pressed against the corner part by heating by the heater and pressurizing by the pressurizing means.

5. The tape attaching apparatus according to claim 2, further comprising a frame holding table having base for supporting the base of the mounting means and being supported by a bottom section of the accommodating chamber, a tubular holding section provided on a periphery of the base, and a second suction passage extending through the base of the frame holding table and terminating at the tubular holding section, the second suction passage being in communication with the suction source to provide suction to the tubular holding section for holding the ring frame of the frame unit.

6. The tape attaching apparatus according to claim 1, further comprising:
   a heater for heating the tape,
   wherein the control unit, at a time of pressurizing the inside of the accommodating chamber, heats the tape by use of the heater to soften the tape and presses the tape against the corner part.

7. The tape attaching apparatus according to claim 1,
   wherein the pressurizing means is air supplying means for jetting air, and
   the control unit jets air to the mount surface by use of the air supplying means to clean the mount surface.

\* \* \* \* \*